(12) United States Patent
Karve et al.

(10) Patent No.: US 7,445,981 B1
(45) Date of Patent: Nov. 4, 2008

(54) METHOD FOR FORMING A DUAL METAL GATE STRUCTURE

(75) Inventors: Gauri V. Karve, Fishkill, NY (US); Cristiano Capasso, Austin, TX (US); Srikanth B. Samavedam, Fishkill, NY (US); James K. Schaeffer, Wappingers Falls, NY (US); William J. Taylor, Jr., Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 13 days.

(21) Appl. No.: 11/771,690

(22) Filed: Jun. 29, 2007

(51) Int. Cl.
*H01L 21/8238* (2006.01)

(52) U.S. Cl. .................. 438/199; 257/369

(58) Field of Classification Search ............ 438/195, 438/197, 199, 275, 283
See application file for complete search history.

(56) References Cited

U.S. PATENT DOCUMENTS 6,645,818 B1 * 11/2003 Sing et al. .............. 438/275

6,897,095 B1  5/2005  Adetutu et al.

OTHER PUBLICATIONS

Song, S.C. et al.; "Highly Manufacturable 45nm LSTP CMOSFETs Using Novel Dual High-K and Dual Metal Gate CMOS Integration"; 2006 Symposium on VLSI Technology Digest of Technical Papers; 2006; 2 pages; IEEE.
Harris, H. Rusty et al.; "Band-Engineered Low PMOS VT with High-K/Metal Gates Featured in a Dual Channel CMOS Integration Scheme"; 2007; pp. 154-155; 2007 Symposium on VLSI Technology Digest of Technical Papers.
U.S. Appl. No. 11/559,633, filed Nov. 14, 2006.

* cited by examiner

*Primary Examiner*—David Vu
(74) *Attorney, Agent, or Firm*—Joanna G. Chiu

(57) ABSTRACT

A method includes forming a first gate dielectric layer over a semiconductor layer having a first and a second well region, forming a first metal gate electrode layer over the first gate dielectric, forming a sidewall protection layer over the first metal gate electrode layer and adjacent sidewalls of the first gate dielectric layer and first metal gate electrode layer, forming a channel region layer over the second well region, forming a second gate dielectric layer over the channel region layer, forming a second metal gate electrode layer, and forming a first gate stack including a portion of each of the first gate dielectric layer and first metal gate electrode layer over the first well region and forming a second gate stack including a portion of each of the second gate dielectric layer and second metal gate electrode layer over the channel region layer and over the second well region.

20 Claims, 7 Drawing Sheets

METHOD FOR FORMING A DUAL METAL GATE STRUCTURE

CROSS-REFERENCE TO RELATED APPLICATION(S)

This application is related to U.S. patent application Ser. No. 11/771,721, filed on Jun. 29, 2007, entitled "Method for Forming a Dual Metal Gate Structure," naming Gauri V. Karve, Cristiano Capasso, Srikanth B. Samavedam, James K. Schaeffer, and William J. Taylor, Jr., as inventors, and assigned to the current assignee hereof.

BACKGROUND

1. Field

This disclosure relates generally to semiconductor processing, and more specifically, to a method for forming a dual metal gate structure.

2. Related Art

In the field of semiconductor processing, the use of polysilicon gate structures is becoming increasingly less feasible as gate dielectric thicknesses steadily decrease. As semiconductor processing moves away from the use of silicon dioxide as gate dielectrics in favor of dielectrics having a high dielectric constant (also referred to as high k dielectrics), polysilicon gates become more problematic. One solution to overcoming some of the problems introduced by polysilicon gates is to use metal gates. In dual metal gate processes, a first metal is used to form the gates for PMOS (p-channel metal oxide semiconductor) devices and second different metal is used to form NMOS (n-channel MOS) devices. Through the use of the different metals, the work functions can be optimized for each type of device. However, in conventional dual metal gate integrations, some processing steps, such as the metal etches and hard mask removals, can damage the high k gate dielectrics of the dual metal gate structures, thus degrading device performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Dual metal gate integrations where a first metal gate is used for NMOS devices and a second different metal gate is used for PMOS devices may be used to address the problems associated with polysilicon gates and allows for the work functions to be optimized for each type of device. Also, performance of PMOS and NMOS devices can be further improved through the use of different materials for the channel regions of the devices. For example, an NMOS device may perform well when its channel region is formed in one semiconductor material (such as silicon) while a PMOS device may perform better when its channel region is formed in a different semiconductor material (such as silicon germanium). Therefore, one embodiment described below includes a dual metal integration which also allows for different types of channel regions for NMOS and PMOS devices.

Figure 1:
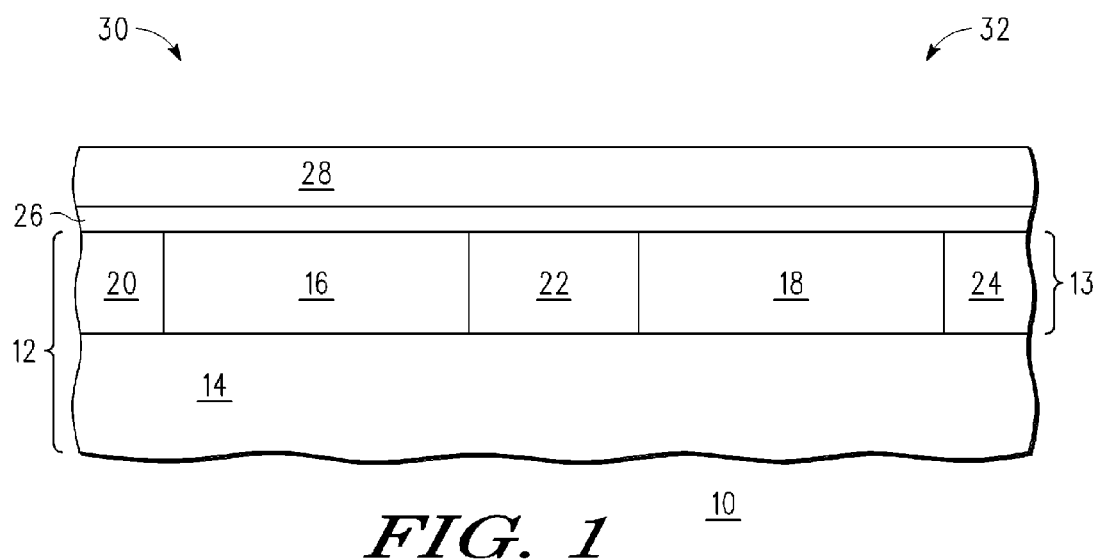
FIG. 1 illustrates a cross-sectional view of a semiconductor structure having a gate dielectric layer over a semiconductor layer and a gate electrode layer over the gate dielectric layer, in accordance with one embodiment.

FIG. 1 illustrates a semiconductor structure 10 having a semiconductor substrate 12. Semiconductor substrate 12 includes a buried oxide layer 14 and a semiconductor layer 13 over buried oxide layer 14. Semiconductor layer 13 includes an NMOS well region 16 which will be used to form an NMOS device and a PMOS well region 18 which will be used to form a PMOS device. Semiconductor layer 13 also includes isolations regions 20, 22, and 24 to isolate different well regions. Note that each well region, such as well regions 16 and 18, may be used to form any number of devices. In the illustrated embodiment, semiconductor substrate is illustrated as a semiconductor-on-insulator (SOI) substrate in which semiconductor layer 13 overlies buried oxide layer 14. However, in an alternate embodiment, substrate 12 can be a bulk semiconductor substrate where buried oxide layer 14 would not be present. Semiconductor layer 13 may include any semiconductor material. In one embodiment, semiconductor layer 13 is a silicon layer.

Semiconductor layer 13 includes an NMOS device region 30, in which one or more NMOS devices will formed, and a PMOS device region 32, in which one or more PMOS devices will be formed. Note that NMOS device region 30 may include any number of NMOS well regions, such as NMOS well region 16, and PMOS device region 32 may include any number of PMOS well regions, such as PMOS well region 18.

FIG. 1 also illustrates a gate dielectric layer 26 over semiconductor layer 13 and a gate electrode layer 28 over gate dielectric layer 26. In one embodiment, gate dielectric layer 26 is blanket deposited over semiconductor layer 13 and gate electrode layer 28 is blanket deposited over gate dielectric layer 26. In one embodiment, gate dielectric layer 26 is a high k gate dielectric including, for example, hafnium oxide or hafnium zirconium oxide. (Note that, as used herein, a high k dielectric refers to a dielectric having a dielectric constant, k, greater than that of silicon dioxide.) Furthermore, gate dielectric layer 26 may include more than one layer, such as a high k dielectric layer capped with an oxide. In one embodiment, gate dielectric layer 26 may have a thickness in a range of approximately 1 to 5 nanometers. In one embodiment, gate electrode layer 28 includes a metal such as, for example, tantalum carbide, tantalum nitride, titanium nitride, or the like. In one embodiment, gate electrode layer 28 has a thickness in a range of approximately 2 to 10 nanometers. In the illustrated embodiment, note that gate dielectric layer 26 and gate electrode layer 28 are the gate dielectric layer and gate electrode layer, respectively, that will be used to form an NMOS device in NMOS device region 30.

Figure 2:
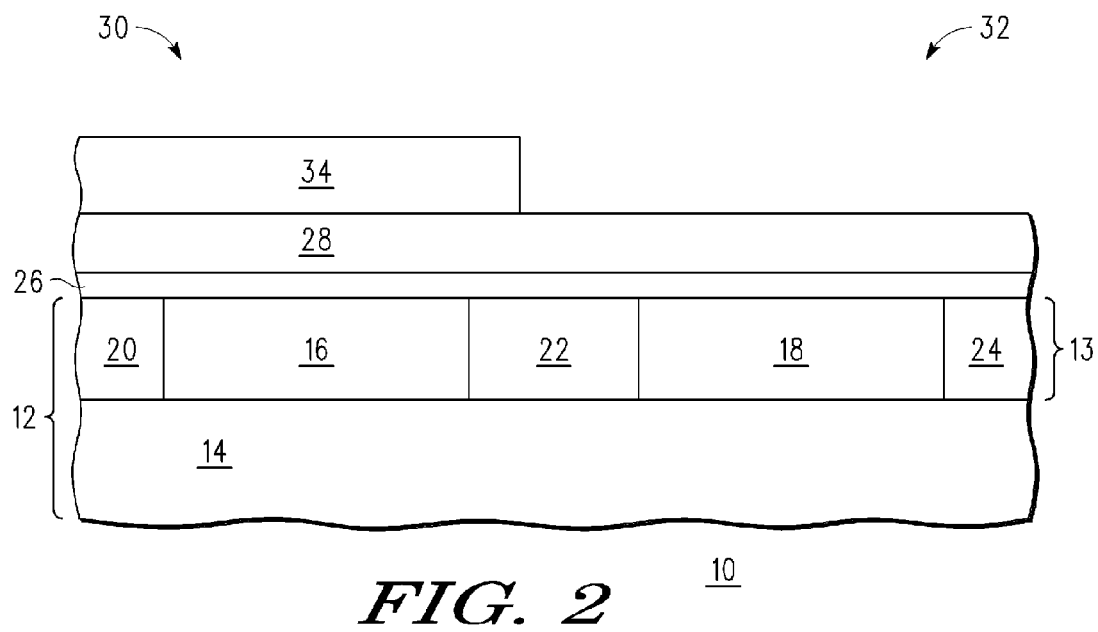
FIG. 2 illustrates a cross-sectional view of the semiconductor structure of FIG. 1 after formation of a patterned masking layer over the gate electrode layer, in accordance with one embodiment.

FIG. 2 illustrates semiconductor structure 10 after the formation of a patterned masking layer 34 over gate electrode layer 28 in NMOS device region 30. In one embodiment, patterned masking layer 34 is a hard mask which includes, for example, a plasma enhanced nitride or an oxide. Alternatively, patterned masking layer 34 may include photoresist. In one embodiment, conventional processing may be used to form patterned masking layer 34.

Figure 3:
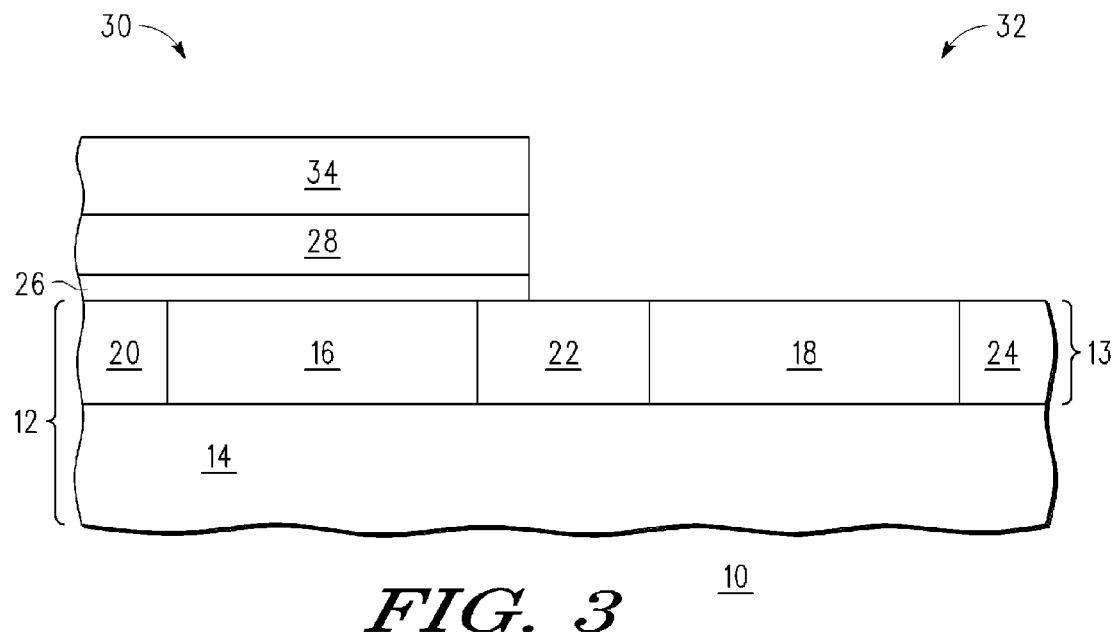
FIG. 3 illustrates a cross-sectional view of the semiconductor structure of FIG. 2 after removing exposed portions of the gate electrode layer and gate dielectric layer, in accordance with one embodiment.

FIG. 3 illustrates semiconductor structure 10 after the removal of exposed portions of gate electrode layer 28 and gate dielectric layer 26 using patterned masking layer 34. Therefore, note that through the use of patterned masking layer 34, those portions of gate electrode layer 28 and gate dielectric layer 26 within PMOS device region 32 can be removed to expose PMOS well region 18 of semiconductor layer 13. In one embodiment, conventional etching processes and chemicals may be used to remove exposed portions of gate electrode layer 28 and gate dielectric layer 26.

Figure 4:
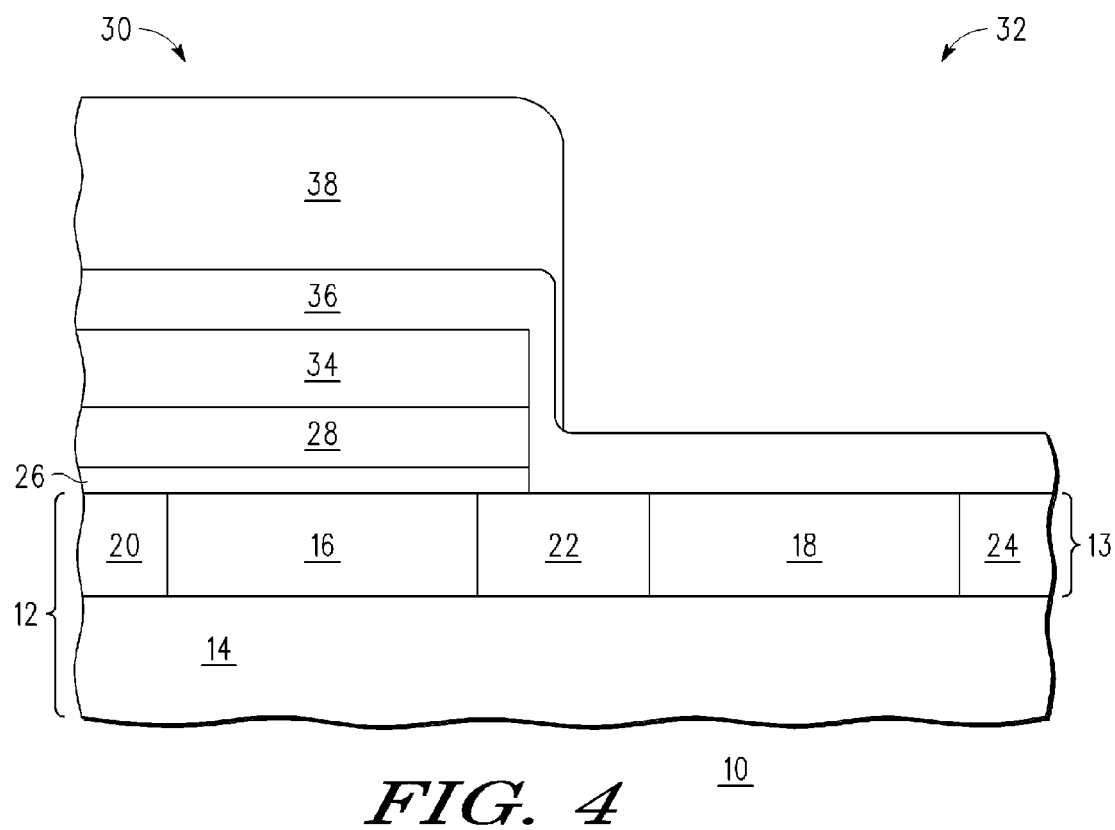
FIG. 4 illustrates a cross-sectional view of the semiconductor structure of FIG. 3 after formation of a sidewall protection layer over the patterned masking layer formed in FIG. 2 and over the semiconductor layer, and after formation of a patterned masking layer over the sidewall protection layer, in accordance with one embodiment.

FIG. 4 illustrates semiconductor structure 10 after formation of a sidewall protection layer 36 over patterned masking layer 34 and over exposed portions of semiconductor layer 13. Note that sidewall protection layer 36 is formed over patterned masking layer 34 and is formed adjacent sidewalls of gate electrode layer 28 and gate dielectric layer 26 which were exposed during the etch of these layers described above in reference to FIG. 3. In one embodiment, sidewall protection layer 36 is blanket deposited. Also, in one embodiment, sidewall protection layer 36 is in physical contact with the sidewalls of gate electrode layer 28 and gate dielectric layer 26. In one embodiment, sidewall protection layer 36 may be an oxide layer or a nitride layer having a thickness, for example, in a range of approximately 5 to 15 nanometers. FIG. 4 also includes the formation of a patterned masking layer 38 formed over sidewall protection layer 36 in NMOS device region 30. In one embodiment, patterned masking layer 38 includes photoresist and may be formed using conventional processing.

Figure 5:
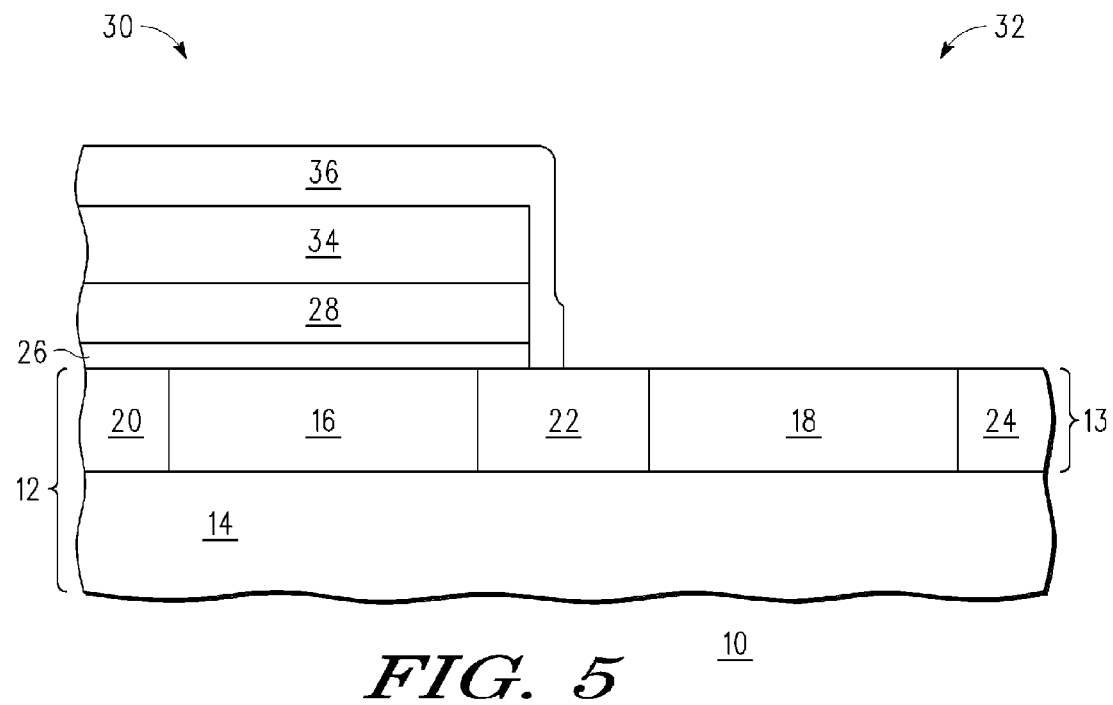
FIG. 5 illustrates a cross-sectional view of the semiconductor structure of FIG. 4 after patterning the sidewall protection layer using the patterned masking layer formed in FIG. 4, in accordance with one embodiment.

FIG. 5 illustrates semiconductor structure 10 after removal of exposed portions of sidewall protection layer 36 using patterned masking layer 36. Therefore, note that through the use of patterned masking layer 36, those portions of sidewall protection layer 36 within PMOS device region 32 can be removed to expose PMOS well region 18 of semiconductor layer 13 while allowing the sidewalls of gate electrode layer 28 and gate dielectric layer 26 in NMOS device region 30 to remain covered and thus protected. Subsequently, patterned masking layer 34 can be removed, as can be seen in FIG. 5. In one embodiment, conventional processing can be used to etch sidewall protection layer 36 and remove patterned masking layer 34.

Figure 6:
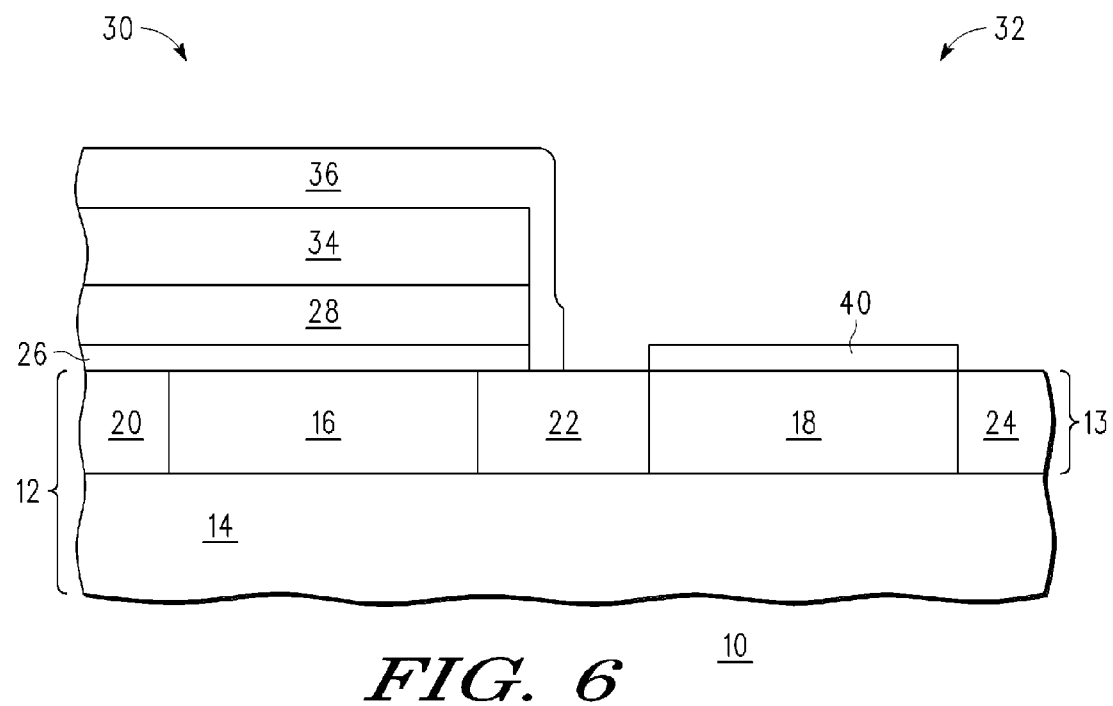
FIG. 6 illustrates a cross-sectional view of the semiconductor structure of FIG. 5 after formation of a channel region layer, in accordance with one embodiment.

FIG. 6 illustrates semiconductor structure 10 after the formation of a channel region layer 40 over PMOS well region 18 within PMOS device region 32. Channel region layer 40 is a layer which will contain a channel region of a PMOS device. Therefore, channel region layer 40 may be a layer which includes a semiconductor material that is different from the semiconductor material of semiconductor layer 13 (or of NMOS well region 16) and which may be better suited for PMOS devices. For example, it may be a material which affects strain, bandgap, mobility, or the like, or any combination thereof. For example, in one embodiment, channel region layer 40 is a silicon germanium layer which allows for improved PMOS devices as compared to silicon. Therefore, in one embodiment, well regions 16 and 18 of semiconductor layer 13 may be silicon while channel region layer 40 may be silicon germanium. In one embodiment, the silicon germanium is epitaxially grown to a thickness in a range of approximately 2 to 15 nanometers at a temperature in range of approximately 550 to 700 degrees Celsius and has a germanium concentration in a range of approximately 10 to 50 percent. Note that during the formation of channel region layer 40, the sidewalls of gate electrode layer 28 and gate dielectric layer 26 are protected by sidewall protection layer 36. For example, if channel region layer 40 is epitaxially grown without sidewall protection layer 36 present, the sidewalls of gate electrode layer 28 and gate dielectric layer 26 may be affected during the formation of channel region layer 40 which may negatively impact the formation or performance of the NMOS devices.

Figure 7:
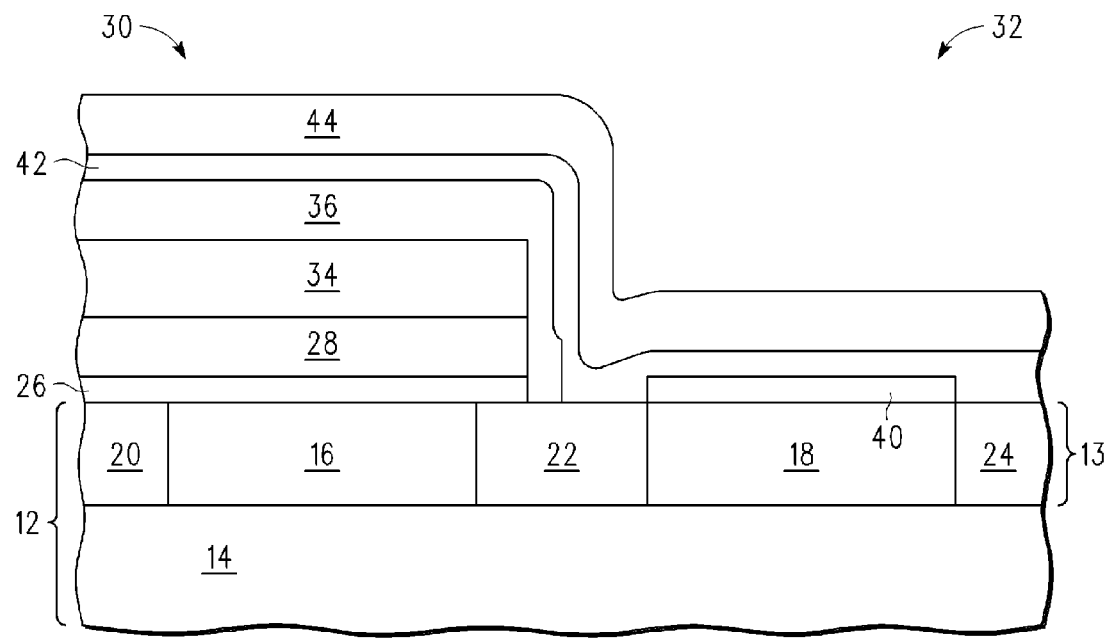
FIG. 7 illustrates a cross-sectional view of the semiconductor structure of FIG. 6 after formation of a gate dielectric layer over the channel region layer and the sidewall protection layer and a gate electrode layer over the gate dielectric layer, in accordance with one embodiment.

FIG. 7 illustrates semiconductor structure 10 after the formation of a gate dielectric layer 42 over sidewall protection layer 36 in NMOS device region 30 and over semiconductor layer 13 and channel region layer 40 in PMOS device region 32, and a gate electrode layer 44 over gate dielectric layer 42. In one embodiment, gate dielectric layer 42 is blanket deposited over sidewall protection layer 36, semiconductor layer 13, and channel region 40, and gate electrode layer 44 is blanket deposited over gate dielectric layer 42. In one embodiment, gate dielectric layer 42 is a high k gate dielectric including, for example, hafnium oxide or hafnium zirconium oxide. (Note that, in one embodiment, gate dielectric layer 42 is formed using a different high k dielectric than gate dielectric 26.) Furthermore, gate dielectric layer 42 may include more than one layer, such as a high k dielectric layer capped with an oxide. In one embodiment, gate dielectric layer 42 may have a thickness in a range of approximately 1 to 5 nanometers. In one embodiment, gate electrode layer 44 includes a metal such as, for example, molybdenum nitride, ruthenium, or the like. Also, in one embodiment, gate electrode layer 44 is formed with a metal that is different from the metal of gate electrode layer 28. In one embodiment, gate electrode layer 44 has a thickness in a range of approximately 2 to 10 nanometers. In the illustrated embodiment, note that gate dielectric layer 42 and gate electrode layer 44 are the gate dielectric layer and gate electrode layer, respectively, that will be used to form a PMOS device in PMOS device region 32.

Note that NMOS device region 30 may be referred to as a first device region, and similarly, NMOS well region 16 may be referred to as a first well region, and PMOS device region 32 may be referred to as a second device region, and similarly, PMOS well region 18 may be referred to as a second well region. Also, note that the polarities may be reversed, such that the first device region corresponds to a PMOS device region and the second device region corresponds to an NMOS device region. Similarly, in this embodiment, the first well region corresponds to a PMOS well region and the second well region corresponds to an NMOS well region. Also, in this case, gate dielectric layer 26 and gate electrode layer 28 would correspond to the gate dielectric layer and gate electrode layer, respectively, that would be used to form a PMOS device while gate dielectric layer 42 and gate electrode layer 44 would correspond to the gate dielectric layer and gate electrode layer, respectively, that would be used to form an NMOS device.

Figure 8:
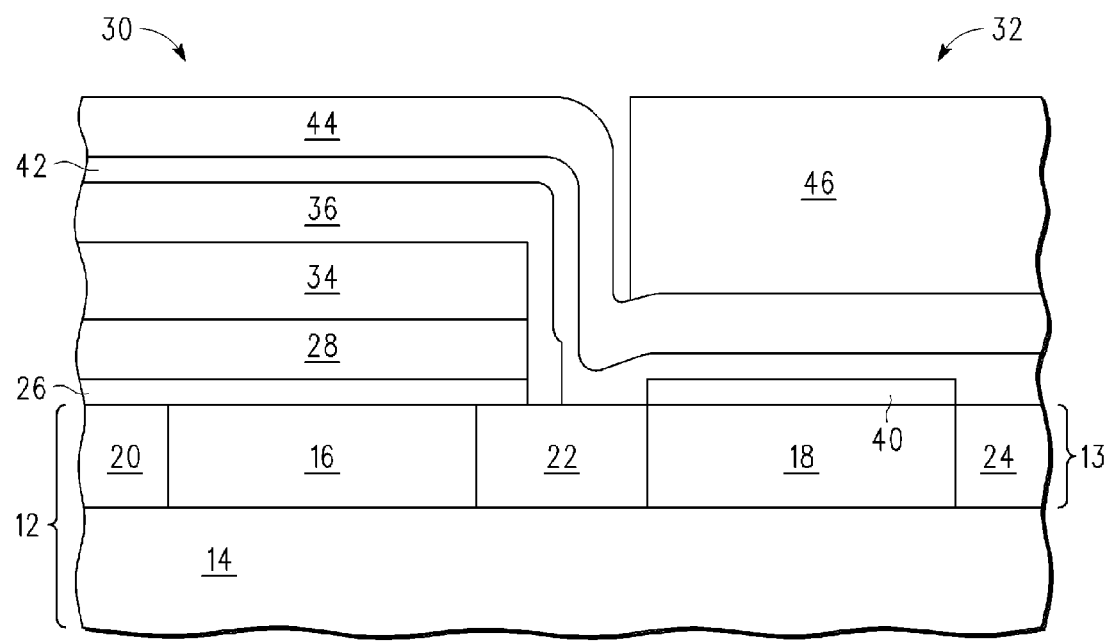
FIG. 8 illustrates a cross-sectional view of the semiconductor structure of FIG. 7 after formation of a patterned masking layer over the gate electrode layer formed in FIG. 7, in accordance with one embodiment.

FIG. 8 illustrates semiconductor structure 10 after the formation of a patterned masking layer 46 over gate electrode layer 44 in PMOS device region 32. In one embodiment, patterned masking layer 46 is formed using photoresist. In one embodiment, conventional processing may be used to form patterned masking layer 46.

Figure 9:
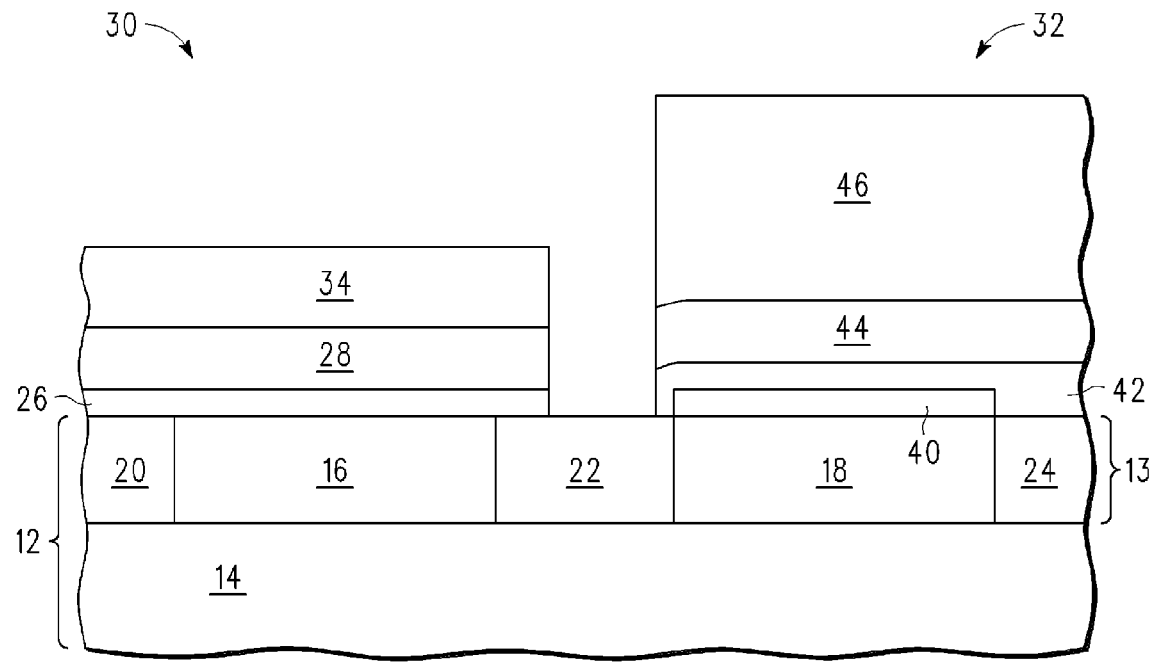
FIG. 9 illustrates a cross-sectional view of the semiconductor structure of FIG. 8 after removing portions of the gate electrode layer and the gate dielectric layer formed in FIG. 7 and after removing the sidewall protection layer, in accordance with one embodiment.

FIG. 9 illustrates semiconductor structure 10 after removing exposed portions of gate electrode layer 44, gate dielectric layer 42, and sidewall protection layer 36 using patterned masking layer 46. Therefore, note that through the use of patterned masking layer 46, those portions of gate electrode layer 44, gate dielectric layer 42, and sidewall protection layer 36 within NMOS device region 30 can be etched where, in one embodiment, patterned masking layer 34 operates as an etch stop layer for the etch. In one embodiment, conventional etching may be used to remove the portions of gate electrode layer 44, gate dielectric layer 42, and sidewall protection layer 36.

Figure 10:
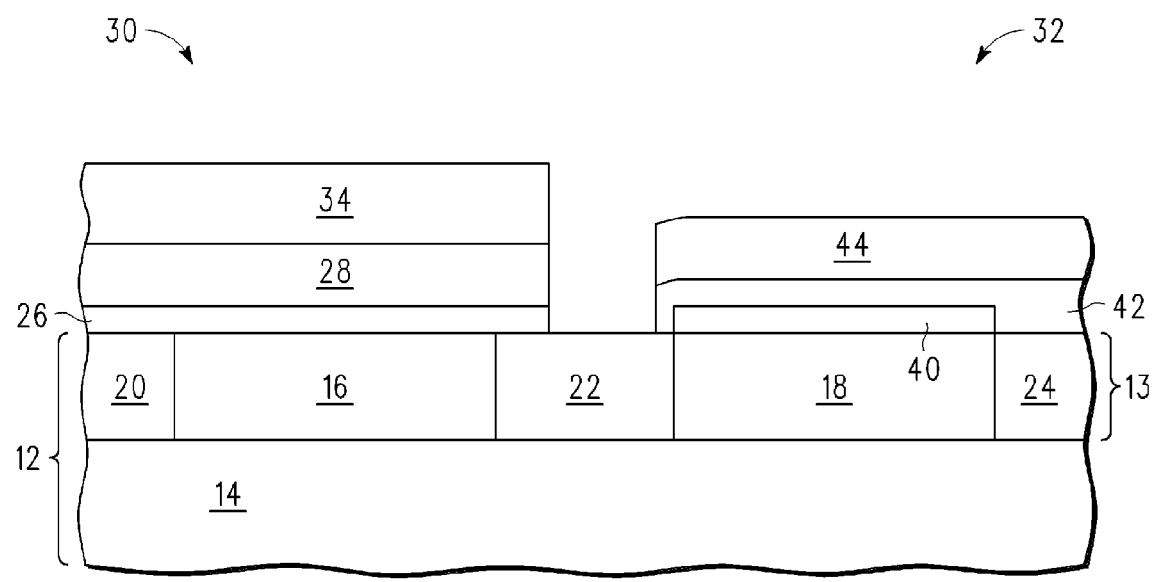
FIG. 10 illustrates a cross-sectional view of the semiconductor structure of FIG. 9 after removing the patterned masking layer formed in FIG. 8, in accordance with one embodiment.

FIG. 10 illustrates semiconductor structure 10 after removing patterned masking layer 46. Conventional processing may be used to remove patterned masking layer 46.

Figure 11:
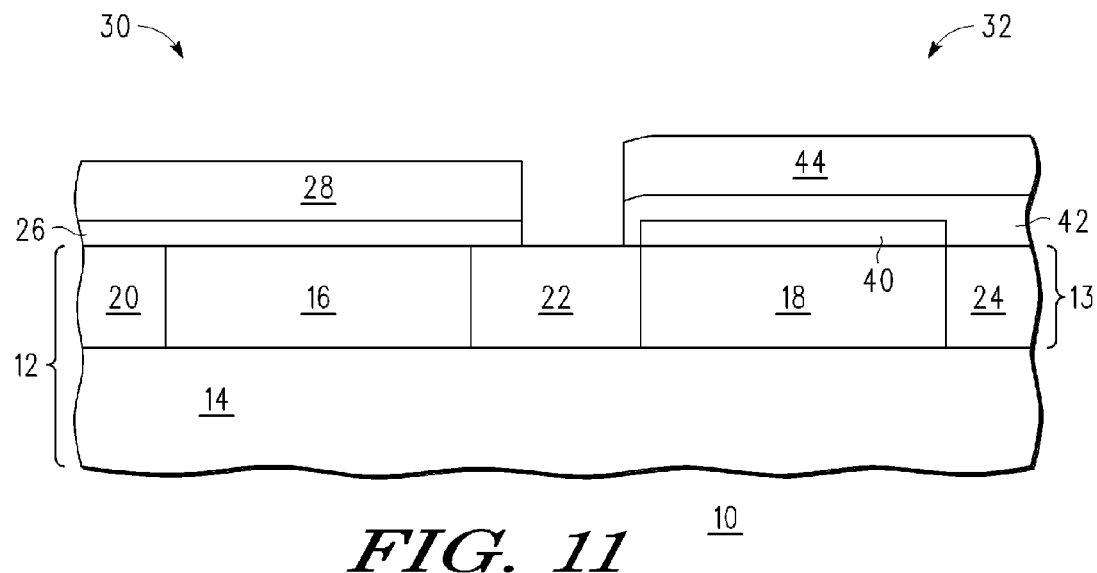
FIG. 11 illustrates a cross-sectional view of the semiconductor structure of FIG. 10 after removal of the patterned masking layer formed in FIG. 2, in accordance with one embodiment.

FIG. 11 illustrates semiconductor structure 10 after removing patterned masking layer 34. In one embodiment, a wet etch, such as a hydrofluoric (HF) etch, may be used to remove patterned masking layer 34 (which, as discussed above, may be formed using a plasma enhanced nitride or an oxide).

Figure 12:
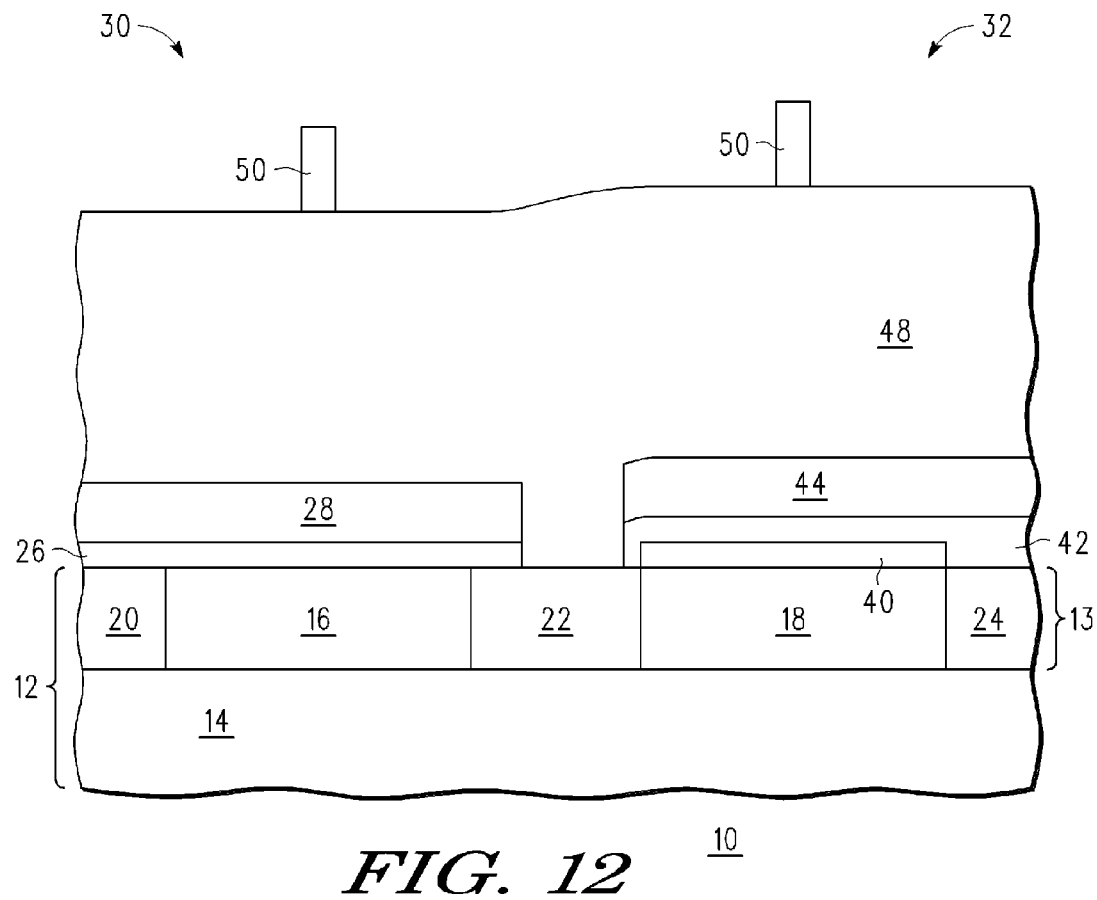
FIG. 12 illustrates a cross-sectional view of the semiconductor structure of FIG. 11 after formation of a gate thickening layer over the gate electrode layers and a patterned masking layer over the gate thickening layer, in accordance with one embodiment.

FIG. 12 illustrates semiconductor structure 10 after the formation of a gate thickening layer 48 over gate electrode layers 28 and 44, and after formation of a patterned masking layer 50 over gate thickening layer 48. In one embodiment, gate thickening layer 48 includes a conductive material, such as, for example, polycrystalline silicon, and may therefore also be referred to as a conductive gate thickening layer. Also, gate thickening layer 48 may include one or more layers of conductive materials. In one embodiment, gate thickening layer 48 operates to thicken the gate stacks of the devices being formed so that when source and drain implants are performed, the gate stacks are thick enough to block the implants in the channel region. In an alternate embodiment, no gate thickening layers may be formed. Patterned masking layer 50 defines locations corresponding to the gate stacks of the devices being formed. In the illustrated embodiment, patterned masking layer 50 defines a gate stack location in NMOS device region 30 and a gate stack location in PMOS device region 32. In one embodiment, pattered masking layer 50 includes photoresist. In one embodiment, conventional processing may be used to form gate thickening layer 48 and patterned masking layer 50.

Figure 13:
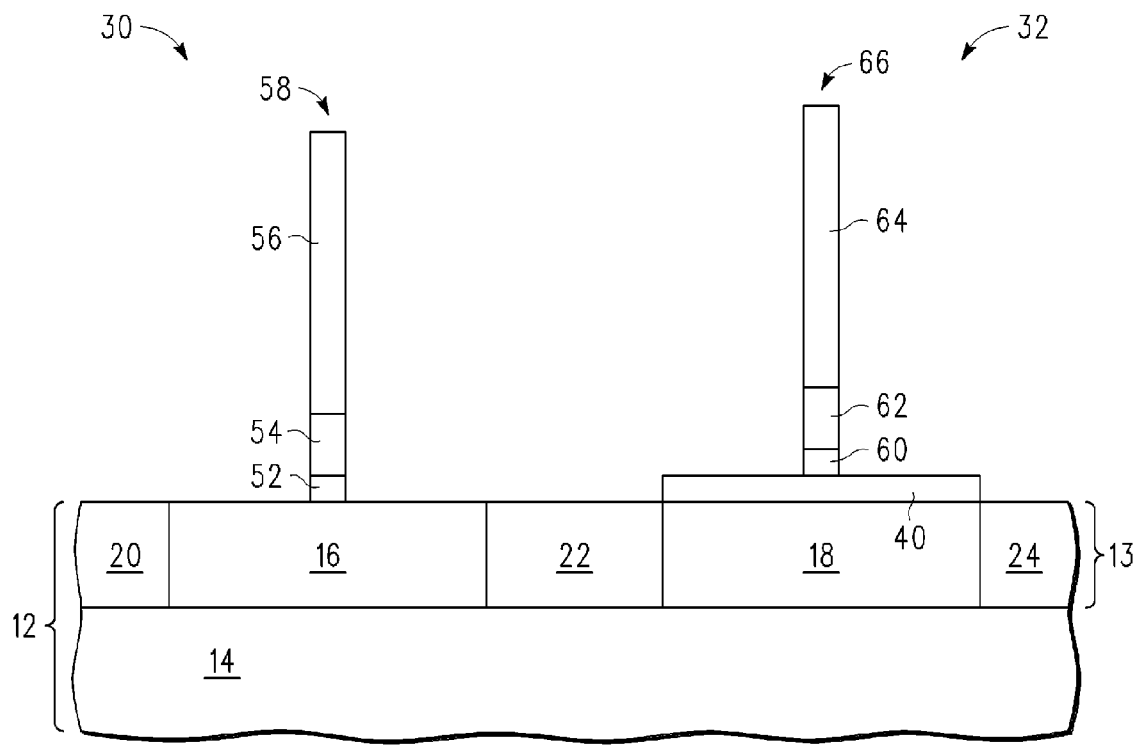
FIG. 13 illustrates a cross-sectional view of the semiconductor structure of FIG. 12 after forming two gate stacks, in accordance with one embodiment.

FIG. 13 illustrates semiconductor structure 10 after the formation of gate stacks 58 and 66 using patterned masking layer 50 and after subsequent removal of patterned masking layer 50. Therefore, using patterned masking layer 50, exposed portions of gate thickening layer 48 are removed from device regions 30 and 32, portions of gate electrode layer 28 and gate dielectric layer 26 are removed from NMOS device region 30, and portions of gate electrode layer 44 and gate dielectric layer 42 are removed from PMOS device region 32, thus resulting in gate stack 58 in NMOS device region 30 and gate stack 66 in PMOS device region 32. Note that during the etch of the embodiment of FIG. 13, both metal gate electrode layers (gate electrode layers 28 and 44) are etched simultaneously. In one embodiment, conventional processing may be used to form gate stacks 58 and 66 and patterned masking layer 50.

As illustrated in FIG. 13, gate stack 58 includes a gate dielectric 52 (formed from gate dielectric layer 26) over NMOS well region 16, a gate electrode 54 (formed from gate electrode layer 28) over gate dielectric 52, and a gate thickener 56 (formed from gate thickening layer 48) over gate electrode 54. Gate stack 66 includes a gate dielectric 60 (formed from gate dielectric layer 42) over channel region layer 40, a gate electrode 62 (formed from gate electrode layer 44) over gate dielectric 60, and a gate thickener 64 (formed from gate thickening layer 48) over gate electrode 62.

Figure 14:
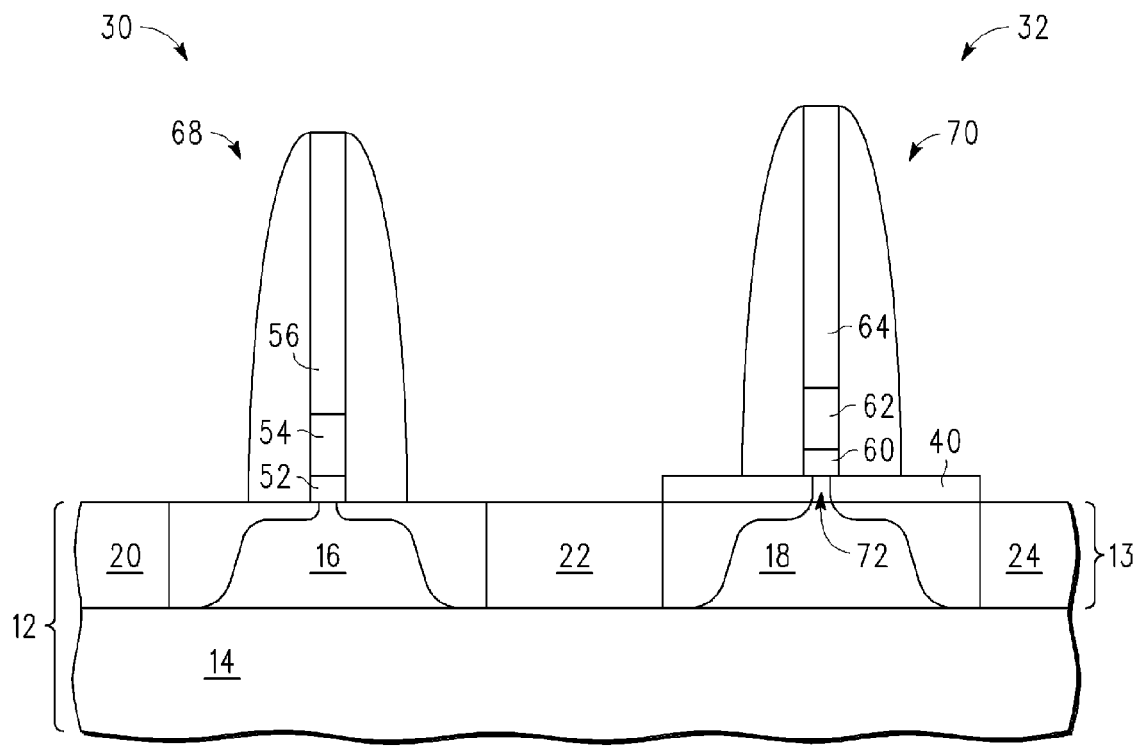
FIG. 14 illustrates a cross-sectional view of the semiconductor structure of FIG. 13 after forming substantially completed semiconductor devices with the gate stacks of FIG. 13, in accordance with one embodiment.

FIG. 14 illustrates semiconductor structure 10 after the formation of substantially completed NMOS device 68 and PMOS device 70. NMOS device 68 is formed using gate stack 58 in NMOS device region 30 and PMOS device is formed using gate stack 66 in PMOS device region 32. For each device, conventional processing may be used to form spacers and source/drain regions. Note that a channel region is formed between source/drain regions of NMOS device 68 under gate dielectric 52 in NMOS well regions 16 of semiconductor layer 13. However, a channel region of PMOS device 70 is located between source/drain regions of PMOS device 70 under gate dielectric 60 in channel region layer 40 rather than in semiconductor layer 13. In this manner, NMOS and PMOS devices 68 and 70 may include different metal gate electrodes and be formed having different semiconductor materials for the channel regions. Therefore, the NMOS and PMOS devices can each be optimized separately through the selection of different metal gate electrodes and different channel region materials.

Therefore, it can be appreciated that through the use of sidewall protection layer 36, channel region layer 40 can be formed without damaging exposed sidewalls of gate electrode layer 28 and gate dielectric layer 26, which were previously patterned. Furthermore, since these layers were previously patterned, a metal gate electrode layer does not need to be subsequently etched from device region 32 over channel region layer 40. In this manner, after the formation of channel region layer 40, a subsequent etch of an overlying metal gate electrode layer is not needed which may cause damage to either gate dielectric layer 42 or channel region layer 40. Therefore, a channel region layer can be formed that is better suited for the particular type of device being formed in device region 32 (whether it be a PMOS or an NMOS device) while allowing for a dual metal integration that does not damage the channel region/gate dielectric interface.

In an alternate embodiment, note that a channel region layer such as channel region layer 40 may be used for forming an NMOS device rather than a PMOS device. In yet another embodiment, a channel region layer such as channel region layer 40 may be used for forming both an NMOS and a PMOS device. For example, a channel region layer may also be formed over well region 16 prior to the formation of gate dielectric layer 26.

One embodiment relates to a method for forming a semiconductor structure including forming a first gate dielectric layer over a semiconductor layer where the semiconductor layer includes a first well region and a second well region, forming a first metal gate electrode layer over the first gate dielectric, forming a sidewall protection layer over the first metal gate electrode layer where the sidewall protection layer is adjacent a sidewall of the first gate dielectric layer and a sidewall of the first metal gate electrode layer, forming a channel region layer over the second well region after forming the sidewall protection layer, forming a second gate dielectric layer over the channel region layer, forming a second metal gate electrode layer over the second gate dielectric layer where the second metal gate electrode layer is a different metal than the first metal gate electrode layer, and forming a first gate stack including a portion of each of the first gate dielectric layer and the first metal gate electrode layer over the first well region and forming a second gate stack including a portion of each of the second gate dielectric layer and the second metal gate electrode layer over the channel region layer and over the second well region.

In a further embodiment, the method further includes forming a first device having a first conductivity type using the first gate stack and forming a second device having a second conductivity type, different from the first conductivity type, using the second gate stack, where a channel region of the second device is in the channel region layer.

In another further embodiment, the method further includes, prior to the forming the first gate stack and the second gate stack, forming a conductive gate thickening layer on and in physical contact with each of the first metal gate electrode layer and the second metal gate electrode layer.

In another further embodiment, the forming the channel region layer comprises growing a semiconductor material that is different from a semiconductor material of the semiconductor layer. In yet a further embodiment of the another embodiment, the forming the channel region layer comprises epitaxially growing silicon germanium over the second well region.

In another further embodiment, the method further includes removing the sidewall protection layer after forming the channel region layer.

In another further embodiment, the forming the sidewall protection layer includes depositing a material selected from a group consisting of an oxide and a nitride.

In another further embodiment, the forming the first gate dielectric layer includes forming a first high k dielectric layer and forming the second gate dielectric layer includes forming a second high k dielectric layer which includes a different high k dielectric than the first high k dielectric layer.

In an another embodiment, a method for forming a semiconductor structure includes forming a first gate dielectric layer over a semiconductor layer where the semiconductor layer includes a first well region and a second well region, forming a first metal gate electrode layer over the first gate dielectric layer, removing portions of the first gate dielectric layer and the first metal gate electrode layer which overlie the second well region, forming a sidewall protection layer over the first metal gate electrode layer and the second well region where the sidewall protection layer is adjacent a sidewall of the first gate dielectric layer and a sidewall of the first metal gate electrode layer, forming a channel region layer over the second well region after forming the sidewall protection layer, forming a second gate dielectric layer over the sidewall protection layer and the channel region layer, forming a second metal gate electrode layer over the second gate dielectric layer where the second metal gate electrode layer is a different metal than the first metal gate electrode layer, removing portions of the second metal gate electrode layer and the second gate dielectric layer which overlie the sidewall protection layer, and forming a first gate stack including a portion of each of the first gate dielectric layer and the first metal gate electrode layer over the first well region and forming a second gate stack including a portion of each of the second gate dielectric layer and the second metal gate electrode layer over the channel region layer and over the second well region.

In a further embodiment of the another embodiment, the method further includes forming a first device having a first conductivity type using the first gate stack and forming a second device having a second conductivity type different from the first conductivity type, using the second gate stack, where a channel region of the second device is in the channel region layer.

In another further embodiment of the another embodiment, prior to the forming the first gate stack and the second gate stack, the method further includes removing the sidewall protection layer and forming a conductive gate thickening layer on and in physical contact with each of the first metal gate electrode layer and the second metal gate electrode layer.

In another further embodiment of the another embodiment, the forming the channel region layer includes growing a semiconductor material that is different from a semiconductor material of the semiconductor layer. In yet a further embodiment of the another further embodiment, the forming the channel region layer includes epitaxially growing silicon germanium over the second well region.

In another further embodiment of the another embodiment, the method further includes removing the sidewall protection layer after the removing portions of the second metal gate electrode layer and the second gate dielectric layer which overlie the sidewall protection layer.

In another further embodiment of the another embodiment, the forming the sidewall protection layer includes depositing a material selected from a group consisting of an oxide and a nitride.

In another further embodiment of the another embodiment, the forming the first gate dielectric layer includes forming a first high k dielectric layer and the forming the second gate dielectric layer includes forming a second high k dielectric layer which includes a different high k dielectric than the first high k dielectric layer.

In yet another embodiment, a method for forming a semiconductor structure includes forming a first high k gate dielectric layer over a semiconductor layer where the semiconductor layer includes a first well region and a second well region, forming a first metal gate electrode layer over the first high k gate dielectric, depositing a sidewall protection layer over the first metal gate electrode layer where the sidewall protection layer is adjacent a sidewall of the first gate dielectric layer and a sidewall of the first metal gate electrode layer, forming a channel region layer over the second well region after forming the sidewall protection layer, forming a second high k gate dielectric layer over the channel region layer where the second high k gate dielectric layer has a different high k dielectric than the first high k gate dielectric layer, forming a second metal gate electrode layer over the second gate dielectric layer where the second metal gate electrode layer is a different metal than the first metal gate electrode layer, forming a first gate stack including a portion of each of the first high k gate dielectric layer and the first metal gate electrode layer over the first well region and forming a second gate stack including a portion of each of the second high k gate dielectric layer and the second metal gate electrode layer over the channel region layer and over the second well region, and forming a first device having a first conductivity type using the first gate stack and forming a second device having a second conductivity type, different from the first conductivity type, using the second gate stack, where a channel region of the second device is in the channel region layer.

In a further embodiment of the yet another embodiment, prior to the forming the first gate stack and the second gate stack, the method further includes forming a conductive gate thickening layer on and in physical contact with each of the first metal gate electrode layer and the second metal gate electrode layer.

In another further embodiment of the yet another embodiment, the forming the channel region layer includes growing a semiconductor material that is different from a semiconductor material of the semiconductor layer.

In another further embodiment of the yet another embodiment, the method further includes removing the sidewall protection layer after the forming the channel region layer.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a semiconductor structure, the method comprising:
    forming a first gate dielectric layer over a semiconductor layer, the semiconductor layer comprising a first well region and a second well region;
    forming a first metal gate electrode layer over the first gate dielectric;
    forming a sidewall protection layer over the first metal gate electrode layer, the sidewall protection layer being adjacent a sidewall of the first gate dielectric layer and a sidewall of the first metal gate electrode layer;
    forming a channel region layer over the second well region after forming the sidewall protection layer;
    forming a second gate dielectric layer over the channel region layer;
    forming a second metal gate electrode layer over the second gate dielectric layer, wherein the second metal gate electrode layer is a different metal than the first metal gate electrode layer; and
    forming a first gate stack comprising a portion of each of the first gate dielectric layer and the first metal gate electrode layer over the first well region and forming a second gate stack comprising a portion of each of the second gate dielectric layer and the second metal gate electrode layer over the channel region layer and over the second well region.

2. The method of claim 1, further comprising:
    forming a first device having a first conductivity type using the first gate stack and forming a second device having a second conductivity type, different from the first conductivity type, using the second gate stack, wherein a channel region of the second device is in the channel region layer.

3. The method of claim 1, further comprising, prior to the forming the first gate stack and the second gate stack, forming a conductive gate thickening layer on and in physical contact with each of the first metal gate electrode layer and the second metal gate electrode layer.

4. The method of claim 1, wherein the forming the channel region layer comprises growing a semiconductor material that is different from a semiconductor material of the semiconductor layer.

5. The method of claim 4, wherein the forming the channel region layer comprises epitaxially growing silicon germanium over the second well region.

6. The method of claim 1, further comprising removing the sidewall protection layer after forming the channel region layer.

7. The method of claim 1, wherein the forming the sidewall protection layer comprises depositing a material selected from a group consisting of an oxide and a nitride.

8. The method of claim 1, wherein the forming the first gate dielectric layer comprises forming a first high k dielectric layer and forming the second gate dielectric layer comprises forming a second high k dielectric layer which includes a different high k dielectric than the first high k dielectric layer.

9. A method for forming a semiconductor structure, the method comprising:
    forming a first gate dielectric layer over a semiconductor layer, the semiconductor layer comprising a first well region and a second well region;
    forming a first metal gate electrode layer over the first gate dielectric layer;
    removing portions of the first gate dielectric layer and the first metal gate electrode layer which overlie the second well region;

forming a sidewall protection layer over the first metal gate electrode layer and the second well region, the sidewall protection layer being adjacent a sidewall of the first gate dielectric layer and a sidewall of the first metal gate electrode layer;

removing portions of the sidewall protection layer which overlie the second well region to expose the second well region;

forming a channel region layer over the second well region;

forming a second gate dielectric layer over the sidewall protection layer and the channel region layer;

forming a second metal gate electrode layer over the second gate dielectric layer, wherein the second metal gate electrode layer is a different metal than the first metal gate electrode layer;

removing portions of the second metal gate electrode layer and the second gate dielectric layer which overlie the sidewall protection layer; and forming a first gate stack comprising a portion of each of the first gate dielectric layer and the first metal gate electrode layer over the first well region and forming a second gate stack comprising a portion of each of the second gate dielectric layer and the second metal gate electrode layer over the channel region layer and over the second well region.

10. The method of claim 9, further comprising:

forming a first device having a first conductivity type using the first gate stack and forming a second device having a second conductivity type, different from the first conductivity type, using the second gate stack, wherein a channel region of the second device is in the channel region layer.

11. The method of claim 9, wherein prior to the forming the first gate stack and the second gate stack, the method further comprises:

removing the sidewall protection layer; and forming a conductive gate thickening layer on and in physical contact with each of the first metal gate electrode layer and the second metal gate electrode layer.

12. The method of claim 9, wherein the forming the channel region layer comprises growing a semiconductor material that is different from a semiconductor material of the semiconductor layer.

13. The method of claim 12, wherein the forming the channel region layer comprises epitaxially growing silicon germanium over the second well region.

14. The method of claim 9, further comprising removing the sidewall protection layer after the removing portions of the second metal gate electrode layer and the second gate dielectric layer which overlie the sidewall protection layer.

15. The method of claim 9, wherein the forming the sidewall protection layer comprises depositing a material selected from a group consisting of an oxide and a nitride.

16. The method of claim 9, wherein the forming the first gate dielectric layer comprises forming a first high k dielectric layer and the forming the second gate dielectric layer comprises forming a second high k dielectric layer which includes a different high k dielectric than the first high k dielectric layer.

17. A method for forming a semiconductor structure, the method comprising:

forming a first high k gate dielectric layer over a semiconductor layer, the semiconductor layer comprising a first well region and a second well region;

forming a first metal gate electrode layer over the first high k gate dielectric;

depositing a sidewall protection layer over the first metal gate electrode layer, the sidewall protection layer being adjacent a sidewall of the first gate dielectric layer and a sidewall of the first metal gate electrode layer;

forming a channel region layer over the second well region after forming the sidewall protection layer;

forming a second high k gate dielectric layer over the channel region layer, the second high k gate dielectric layer having a different high k dielectric than the first high k gate dielectric layer;

forming a second metal gate electrode layer over the second gate dielectric layer, wherein the second metal gate electrode layer is a different metal than the first metal gate electrode layer;

forming a first gate stack comprising a portion of each of the first high k gate dielectric layer and the first metal gate electrode layer over the first well region and forming a second gate stack comprising a portion of each of the second high k gate dielectric layer and the second metal gate electrode layer over the channel region layer and over the second well region; and forming a first device having a first conductivity type using the first gate stack and forming a second device having a second conductivity type, different from the first conductivity type, using the second gate stack, wherein a channel region of the second device is in the channel region layer.

18. The method of claim 17, further comprising, prior to the forming the first gate stack and the second gate stack, forming a conductive gate thickening layer on and in physical contact with each of the first metal gate electrode layer and the second metal gate electrode layer.

19. The method of claim 17, wherein the forming the channel region layer comprises growing a semiconductor material that is different from a semiconductor material of the semiconductor layer.

20. The method of claim 17, further comprising removing the sidewall protection layer after the forming the channel region layer.

* * * * *